United States Patent
Jung et al.

(10) Patent No.: US 9,690,329 B2
(45) Date of Patent: Jun. 27, 2017

(54) DISPLAY MODULE AND DISPLAY APPARATUS HAVING THE SAME

(71) Applicant: SAMSUNG DISPLAY CO., LTD., Yongin, Gyeonggi-Do (KR)

(72) Inventors: Taehyeog Jung, Hwaseong-si (KR); Taehoon Yang, Yongin-si (KR); Kiyong Lee, Cheonan-si (KR); Sang Wol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 14/604,576

(22) Filed: Jan. 23, 2015

(65) Prior Publication Data
US 2015/0382484 A1 Dec. 31, 2015

(30) Foreign Application Priority Data

Jun. 26, 2014 (KR) .......................... 10-2014-0079074

(51) Int. Cl.
*G06F 1/16* (2006.01)
*H04M 1/02* (2006.01)
(Continued)

(52) U.S. Cl.
CPC ...... *G06F 1/1643* (2013.01); *G02F 1/133308* (2013.01); *G06F 1/1626* (2013.01);
(Continued)

(58) Field of Classification Search
CPC .............................. G06F 1/1626; G06F 1/1637
See application file for complete search history.

(56) References Cited

U.S. PATENT DOCUMENTS

2010/0293782 A1* 11/2010 Yamazaki ........... H01L 51/0097
29/825
2012/0287066 A1* 11/2012 Yang ..................... G06F 1/1626
345/173

(Continued)

FOREIGN PATENT DOCUMENTS

JP 2013-167868 A 8/2013
JP 2013-206847 A 10/2013
(Continued)

OTHER PUBLICATIONS

Korean Patent Abstract for KR 2013-0007311 A, which corresponds to KR Publ. No. 10-1320384 B1, published Oct. 23, 2013, 1 page.

*Primary Examiner* — Anthony Q Edwards
(74) *Attorney, Agent, or Firm* — Lewis Roca Rothgerber Christie LLP

(57) ABSTRACT

A display module includes a window member, a display panel, and a protective member. The window member includes a front surface, a rear surface facing the front surface in a thickness direction, and a connection surface coupling the front surface to the rear surface. The display panel includes a display part disposed to be spaced apart from the rear surface of the window member and to display an image toward the window member, and an edge part bent from the display part toward the window member. The protective frame accommodates the display panel and is coupled to at least one of the rear surface of the window member and the connection surface.

20 Claims, 15 Drawing Sheets

(51) Int. Cl.
  *G09G 3/3225* (2016.01)
  *G02F 1/1333* (2006.01)
  *H01L 27/32* (2006.01)
  *H04M 1/18* (2006.01)

(52) U.S. Cl.
  CPC ......... *G06F 1/1637* (2013.01); *G09G 3/3225* (2013.01); *H04M 1/0266* (2013.01); *G02F 2001/133314* (2013.01); *G02F 2001/133331* (2013.01); *G09G 2300/0426* (2013.01); *H01L 27/3244* (2013.01); *H04M 1/185* (2013.01)

(56) References Cited

U.S. PATENT DOCUMENTS

| | | | |
|---|---|---|---|
| 2013/0002133 A1* | 1/2013 | Jin | G06F 1/1626 313/511 |
| 2013/0002572 A1* | 1/2013 | Jin | G02F 1/133305 345/173 |
| 2013/0002583 A1* | 1/2013 | Jin | G06F 1/1637 345/173 |
| 2014/0002385 A1* | 1/2014 | Ka | G06F 1/1601 345/173 |
| 2014/0132488 A1* | 5/2014 | Kim | H01L 51/52 345/76 |
| 2015/0256658 A1* | 9/2015 | Shin | G06F 1/1637 455/566 |

FOREIGN PATENT DOCUMENTS

| | | |
|---|---|---|
| JP | 5444940 B2 | 3/2014 |
| KR | 10-2012-0127038 A | 11/2012 |
| KR | 10-2013-0025763 A | 3/2013 |
| KR | 10-1320384 B1 | 10/2013 |
| KR | 10-2015-0017273 A | 2/2015 |
| KR | 10-2015-0071415 A | 6/2015 |

\* cited by examiner

DISPLAY MODULE AND DISPLAY APPARATUS HAVING THE SAME

CROSS-REFERENCE TO RELATED APPLICATION

This patent application claims priority to and the benefit of Korean Patent Application No. 10-2014-0079074, filed on Jun. 26, 2014, the content of which is hereby incorporated by reference in its entirety.

BACKGROUND

1. Field

The present disclosure relates to a display module and a display apparatus having the same. More particularly, the present disclosure relates to a display module having a bending portion and a display apparatus having the same.

2. Description of the Related Art

In recent years, various display devices, which are applied to a multimedia device, e.g., a television set, a mobile phone, a navigation system, a computer monitor, a game console, etc., have been developed. The display devices provide a user with image information. Each display device includes an area in which an image is displayed and an area in which no image is displayed when viewed in a front view. As the area in which no image is displayed is reduced, a size of the image displayed in the area becomes large.

SUMMARY

The present disclosure provides a display module capable of reducing a bezel area thereof and reducing defects.

The present disclosure provides a display apparatus having the display module.

Embodiments of the inventive concept provide a display module including a window member, a display panel, and a protective frame. The window member includes a front surface, a rear surface facing the front surface in a thickness direction, and a connection surface coupling (connecting) the front surface to the rear surface. The display panel includes a display part disposed to be spaced apart from the rear surface of the window member and to display an image toward the window member and an edge part bent from the display part toward the window member. The protective frame accommodates the display panel and is coupled to at least one of the rear surface of the window member and the connection surface.

In one embodiment, the protective frame includes a bottom portion corresponding to the display part and a sidewall portion bent from the bottom and corresponding to the edge part.

In one embodiment, the edge part includes a first edge part extending from one end of the display part and a second edge part extending from an other end of the display part, which faces the one end in a first direction. The sidewall portion includes a first sidewall portion corresponding to the first edge part and a second sidewall portion corresponding to the second edge part.

In one embodiment, the sidewall portion further includes first and second dummy sidewall portions to connect the first and second sidewall portions, and the first and second dummy sidewall portions face each other in a second direction substantially perpendicular to the first direction.

In one embodiment, the display module further includes a dummy member disposed between the display panel and the window member.

In one embodiment, the display module further includes a touch screen panel disposed between the display panel and the dummy member. The touch screen panel includes a flat surface touch part corresponding to the display part, a first sidewall touch part corresponding to the first edge part, and a second sidewall touch part corresponding to the second edge part. The touch screen panel may be disposed between the window member and the dummy member.

In one embodiment, the display module further includes an optical member disposed between the display panel and the window member.

In one embodiment, the connection surface includes a plurality of side surfaces. The first sidewall portion is coupled to a first side surface of the side surfaces, and the second sidewall portion is coupled to a second side surface of the side surfaces, the second side surface facing the first side surface in the first direction.

In one embodiment, the connection surface includes a plurality of side surfaces and a plurality of step difference surfaces. The window member includes a first step difference portion to connect the rear surface of the window member and a first side surface of the side surfaces and a second step difference portion to connect the rear surface of the window member and a second side surface of the side surfaces, the second side surface facing the first side surface in the first direction, and the step difference surfaces define the first and second step difference portions. The first sidewall portion is coupled to the first step difference portion and the second sidewall portion is coupled to the second step difference portion.

In one embodiment, the display module further includes a black matrix layer disposed on the rear surface of the window member and having an opening formed therethrough to correspond to the display part.

In one embodiment, the display panel includes a base substrate disposed on the protective frame, a plurality of organic light emitting diodes disposed on the base substrate, and a sealing layer disposed on the base substrate to cover the organic light emitting diodes.

Embodiments of the inventive concept provide a display apparatus including one of the display modules described above. In addition, the display apparatus includes a main circuit member electrically coupled (electrically connected) to the display module, a power supply member that applies a driving voltage to the display module and the main circuit member, and a housing that accommodates the main circuit member and is coupled to the display module.

According to the above and embodiments of the present inventive concept, the area of the bezel overlapped with the black matrix layer is reduced due to the edge part being bent from the display part. Therefore, the display area of the display apparatus, in which the image is displayed, may be broadened.

Since the edge part is bent from the display part toward the window member, a compressive stress is applied to at least the sealing layer. Here, in embodiments of the inventive concept and due to the application of compressive stress, the sealing layer is provided to have a greater durability against a tensile stress than that against the compressive stress.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
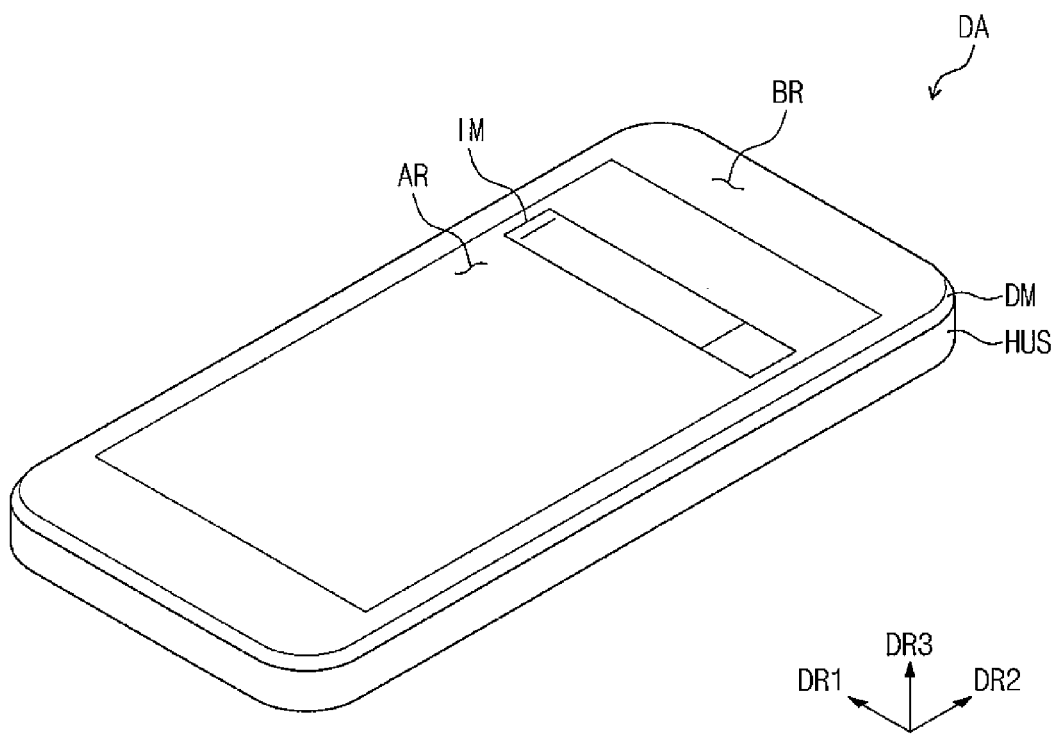
FIG. 1 is a perspective view showing a display apparatus according to an exemplary embodiment of the present disclosure.

It will be understood that when an element or layer is referred to as being "on", "connected to" or "coupled to" another element or layer, it can be directly on, connected or coupled to the other element or layer, or intervening element(s) or layer(s) may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in more detail with reference to the accompanying drawings.

Figure 2:
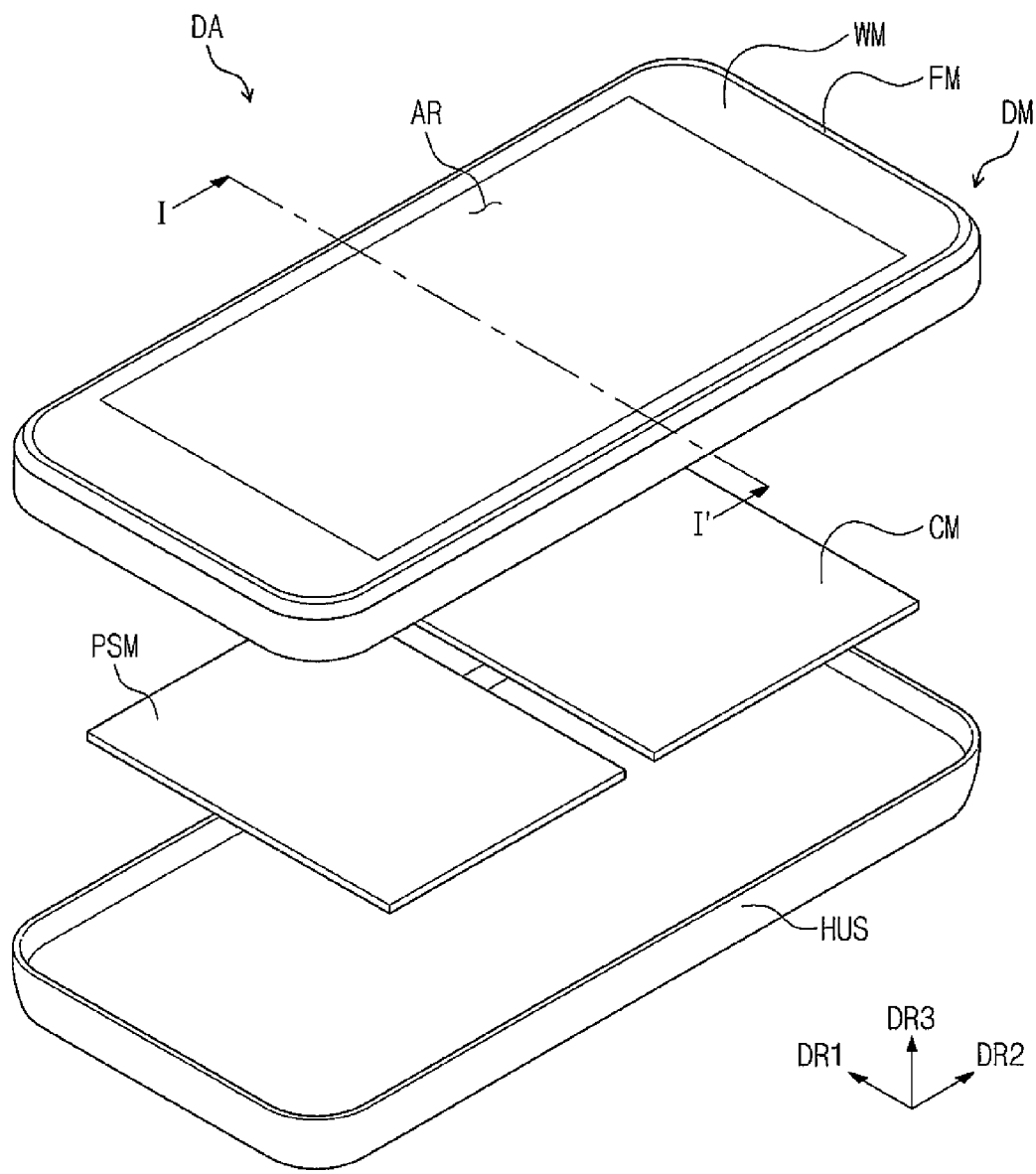
FIG. 2 is an exploded perspective view showing a display apparatus according to an exemplary embodiment of the present disclosure.

FIG. 1 is a perspective view showing a display apparatus according to an exemplary embodiment of the present disclosure, and FIG. 2 is an exploded perspective view showing a display apparatus according to an exemplary embodiment of the present disclosure.

FIG. 1 shows a mobile phone as a representative example, but the display apparatus according to the present disclosure should not be limited to the mobile phone. The display apparatus according to the present disclosure may be applied to a large-scale electronic device, such as a television set, an outdoor advertising plate, etc., or a small/medium electronic device, such as a personal computer, a notebook computer, a personal digital assistant, a navigation system, a game console, a mobile game console, a wrist watch type electric instrument, a digital camera, etc.

Referring to FIG. 1, a display apparatus DA includes a plurality of areas distinct from each other on a display surface. The display apparatus DA includes a display area AR in which an image IM is displayed and a bezel area BR disposed adjacent to the display area AR. In FIG. 1, an internet search window has been shown as the image IM. As an example, the display area AR has a quadrangular shape. The bezel area BR surrounds the display area AR. That is, the bezel area BR corresponds to a border of the display surface.

Referring to FIG. 2, the display apparatus DA includes a display module DM, a main circuit member CM, a power supply member PSM, and a housing HUS. The display module DM generates the image IM (refer to FIG. 1). The display module DM will be described later in more detail.

The main circuit member CM includes various electronic modules to perform various functions of the display apparatus DA. For instance, the main circuit member CM includes a control module, a wireless communication module, an image input module, a sound input module, a sound output module, and a memory. The electronic modules are mounted on a main circuit substrate and electrically connected to each other. The main circuit member CM is electrically connected to the display module DM through a flexible circuit board.

The power supply member PSM supplies a power source required to drive the display apparatus DA. The power supply member PSM supplies a driving voltage to the display module DM and the main circuit member CM.

The housing HUS accommodates at least the main circuit member CM and is coupled with the display module DM. As shown in FIG. 2, the housing HUS may accommodate the power supply member PSM. In FIG. 2, the housing HUS is integrally formed as a single unitary and individual unit, i.e., one member, but in other embodiments the housing HUS may be realized by two members coupled to each other.

Figure 3:
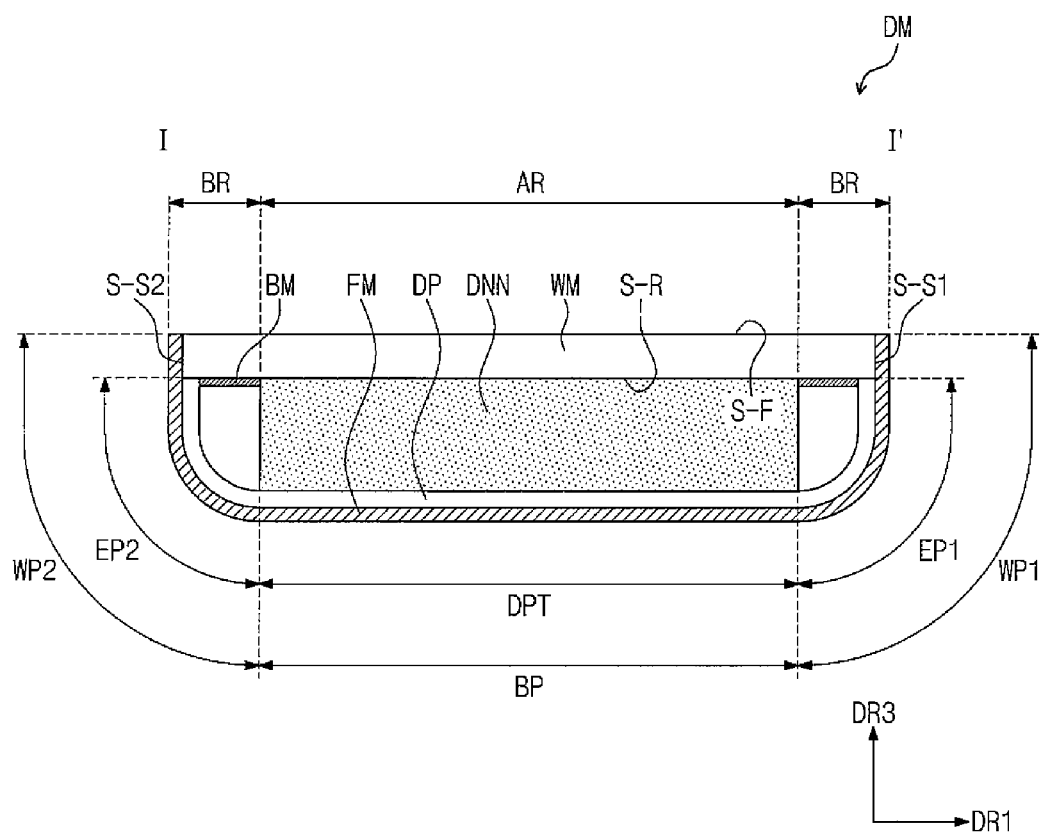
FIG. 3 is a cross-sectional view taken along a line I-I' to show a display module.
Figure 4:
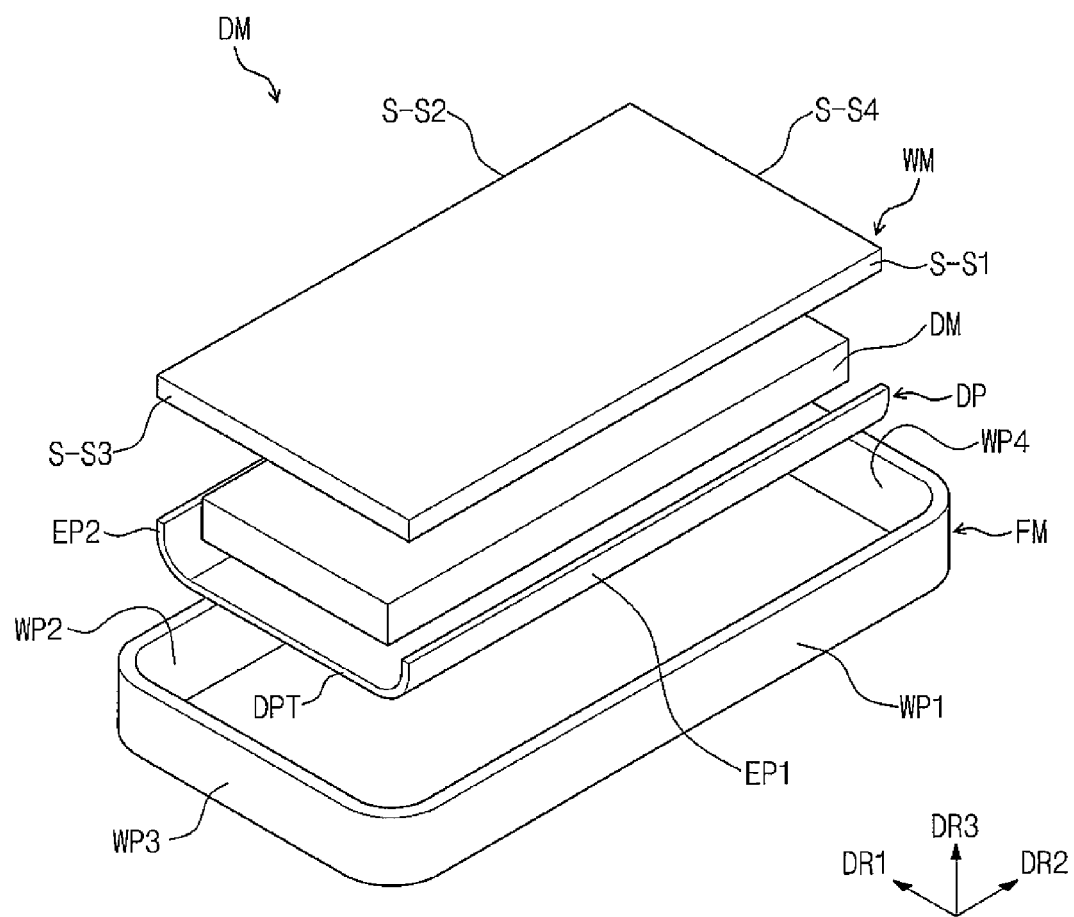
FIG. 4 is an exploded perspective view showing a display module according to an exemplary embodiment of the present disclosure.
Figure 5:
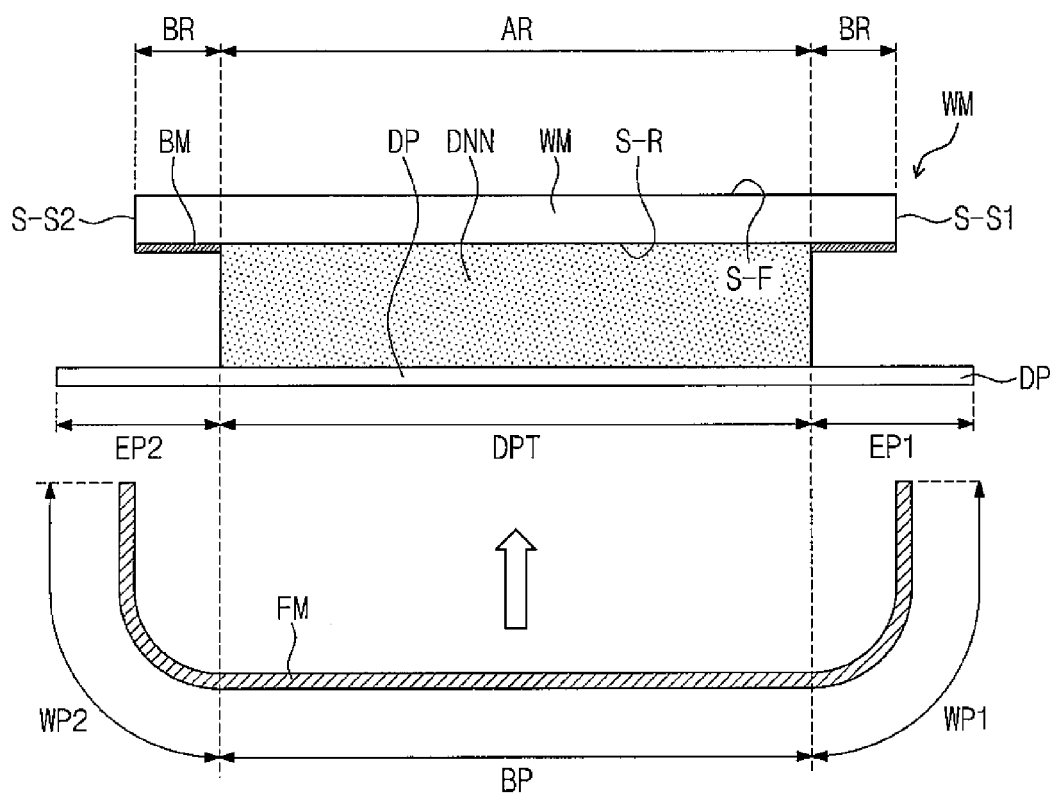
FIG. 5 is a cross-sectional view showing an assembling process of a display module.
Figure 5:
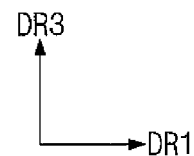

FIG. 3 is a cross-sectional view taken along a line I-I' to show a display module, FIG. 4 is an exploded perspective view showing a display module according to an exemplary embodiment of the present disclosure, and FIG. 5 is a cross-sectional view showing an assembling process of a display module. Hereinafter, the display module DM will be described in detail with reference to FIGS. 3 to 5.

Referring to FIGS. 3 and 4, the display module DM includes a window member WM, a dummy member DNN, a display panel DP, and a protective frame FM. The window member WM, the dummy member DNN, the display panel DP, and the protective frame FM are disposed in the display area AR and sequentially stacked one on another along a third direction DR3.

The window member WM provides the display surface of the display apparatus DA (refer to FIGS. 1 and 2) and a front surface of the display apparatus DA. The window member WM may be, but not limited to, a transparent substrate, e.g., a glass substrate, a plastic substrate, etc. The window member WM includes a front surface S-F, a rear surface S-R facing the front surface S-F in the third direction DR3, and a connection surface that connects the front surface S-F and the rear surface S-R.

In the present exemplary embodiment, the window member WM has a rectangular plate shape when viewed in a plan view, but the shape of the window member WM should not be limited to the rectangular plate shape. That is, the window member WM may have a rounded rectangular plate shape when viewed in a plan view. In the present exemplary embodiment, the connection surface includes four side surfaces S-S1 to S-S4. According to the shape of the window member WM, the connection surface may be realized by one side surface or a plurality of inclined surfaces.

A black matrix layer BM is disposed on the rear surface S-R of the window member WM. The black matrix layer BM may be, but not limited to, an organic layer and/or an inorganic layer, which has a set or predetermined color. The black matrix layer BM has an opening corresponding to the display area AR. The black matrix layer BM is disposed to overlap with the bezel area BR on the display surface. The image generated by the display module DM is provided to the outside of the display module DM through the opening.

The display panel DP includes a display part DPT and edge parts EP1 and EP2 bent from the display part DPT. The display part DPT is overlapped with the display area AR. The display part DPT is spaced apart from the rear surface S-R of the window member WM.

The edge parts EP1 and EP2 are configured to include a first edge part EP1 extending from one side of the display part DPT and a second edge part EP2 extending from the other side of the display part DPT, which faces the one side of the display part DPT in a first direction DR1. The first and second edge parts EP1 and EP2 are bent toward the window member WM with a set or predetermined curvature. Hereinafter, the state that the first and second edge parts EP1 and EP2 are bent toward the window member WM will be referred to as an inward bent, and the state that the first and second edge parts EP1 and EP2 are bent in a direction farther away from the window member WM will be referred to as an outward bent.

At least a portion of the display panel DP has flexibility. When the first and second edge parts EP1 and EP2 are inwardly bent from the display part DPT along imaginary folding lines, the folding lines exist in the portion of the display panel DP, which has the flexibility. In the present exemplary embodiment, the first and second edge parts EP1 and EP2 may have flexibility. In the present exemplary embodiment, the whole portion of the display panel DP may have the flexibility.

The display panel DP may be various suitable panels, such as an organic light emitting diode display panel, a plasma display panel, a liquid crystal display panel, an electrowetting display panel, an electrophoretic display panel, a microelectromechanical system display panel, etc.

The dummy member DNN is disposed between the display panel DP and the window member WM. The dummy member DNN maintains a distance between the display part DPT and the window member WM. The dummy member DNN includes a transparent member, e.g., a plastic member. The dummy member DNN has the same area as that of the display part DPT when viewed in a plan view. This is to provide the same light path between the display part DPT and the window member WM in the display area AR.

Although not shown in detail, a pressure sensitive adhesive layer may be disposed between the dummy member DNN and the window member WM and between the dummy member DNN and the display part DPT. The dummy member DNN may be omitted or replaced with an optical member, e.g., a polarizer.

The protective frame FM accommodates the display panel DP and is coupled to the rear surface S-R of the window member WM and at least one of the side surfaces S-S1 to S-S4. The protective frame FM includes a bottom portion BP corresponding to the display part DPT, a first sidewall portion WP1 corresponding to the first edge part EP1, and a second sidewall portion WP2 corresponding to the second edge part EP2. The bottom portion BP, the first sidewall portion WP1, and the second sidewall portion WP2 support the display part DPT, the first edge part EP1, and the second edge part EP2, respectively. The first and second sidewall portions WP1 and WP2 have a length longer than that of the first and second edge parts EP1 and EP2. The length has been measured in the third direction DR3.

The first and second sidewall portions WP1 and WP2 are respectively coupled to the first and second side surfaces S-S1 and S-S2 among the side surfaces S-S1 to S-S4 of the window member WM, which face each other in the first direction DR1. Different from the display panel DP, the protective frame FM has rigidity. The protective frame FM is formed of a plastic or metal material. The bottom portion BP, the first sidewall portion WP1, and the second sidewall portion WP2 may be integrally formed with each other or coupled to each other after being separately formed.

As shown in FIG. 4, the protective frame FM may further include a third sidewall portion WP3 and a fourth sidewall portion WP4, which face each other in a second direction DR2. The third and fourth sidewall portions WP3 and WP4 connect the first and second sidewall portions WP1 and WP2, but do not support the display panel DP. The third and fourth sidewall portions WP3 and WP4 serve as dummy sidewall portions.

Referring to FIG. 5, the window member WM, the dummy member DNN, and the display panel DP are coupled to each other before the protective frame FM and the window member WM are assembled to each other. The window member WM, the dummy member DNN, and the display panel DP are coupled to each other by the pressure sensitive adhesive layer disposed on the front and rear surfaces of the dummy member DNN.

In this case, the display panel DP is maintained in a flat shape regardless of the area thereof. The display panel DP is divided into the display part DPT, the first edge part EP1, and the second edge part EP2 when the display module DM is manufactured. When the protective frame FM moves along the third direction DR3, the first and second edge parts EP1 and EP2 are inwardly bent. The display panel DP is inwardly bent to have the same shape as that of the protective frame FM.

The window member WM is forcibly inserted into the protective frame FM. Accordingly, the first and second side surfaces S-S1 and S-S2 of the window member WM are respectively coupled to the first and second sidewall portions WP1 and WP2. To improve the adhesive force between the window member WM and the protective frame FM, an adhesive layer may be disposed on the first and second side surfaces S-S1 and S-S2 before the window member WM and the protective frame FM are assembled to each other. In addition, an adhesive layer may be disposed on the rear surface of the display panel DP in order to improve the adhesive force between the protective frame FM and the display panel DP.

As described above, since the first and second edge parts EP1 and EP2 are inwardly bent, the area of the bezel area BR of the display apparatus DA is reduced. In the present exemplary embodiment, the window member WM, the dummy member DNN, and the display panel DP, which are coupled to each other, move toward a direction opposite to the third direction DR3 to couple the window member WM to the protective frame FM after the protective frame FM is fixed.

Figure 6:
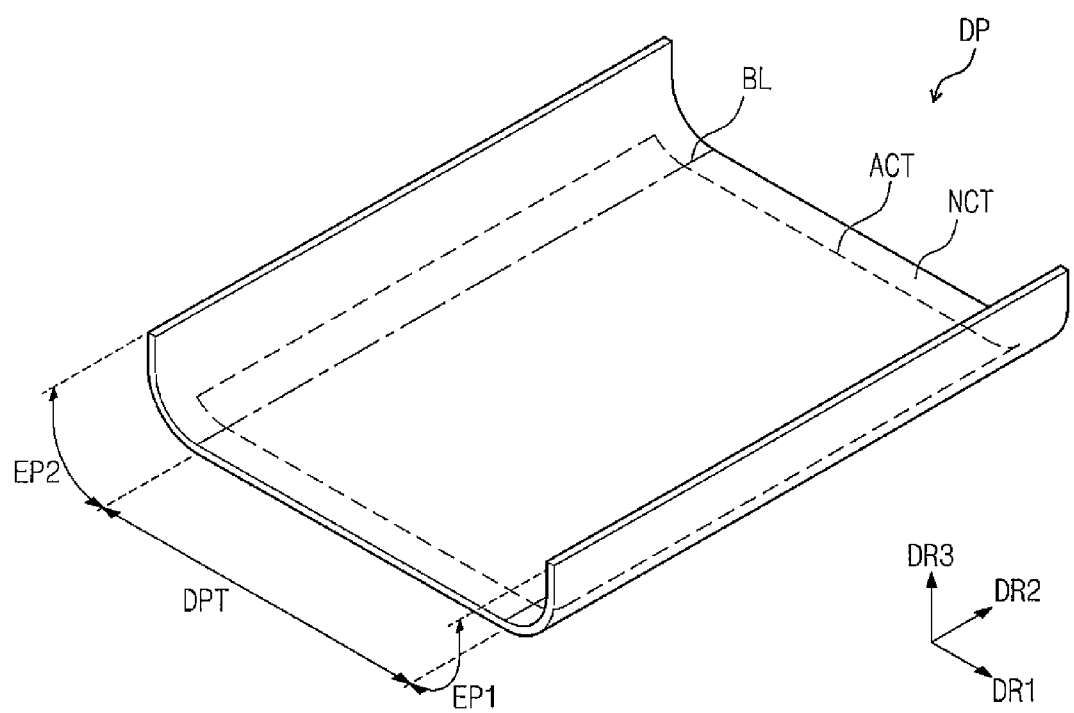
FIG. 6 is a perspective view showing a display panel according to an exemplary embodiment of the present disclosure.
Figure 7:
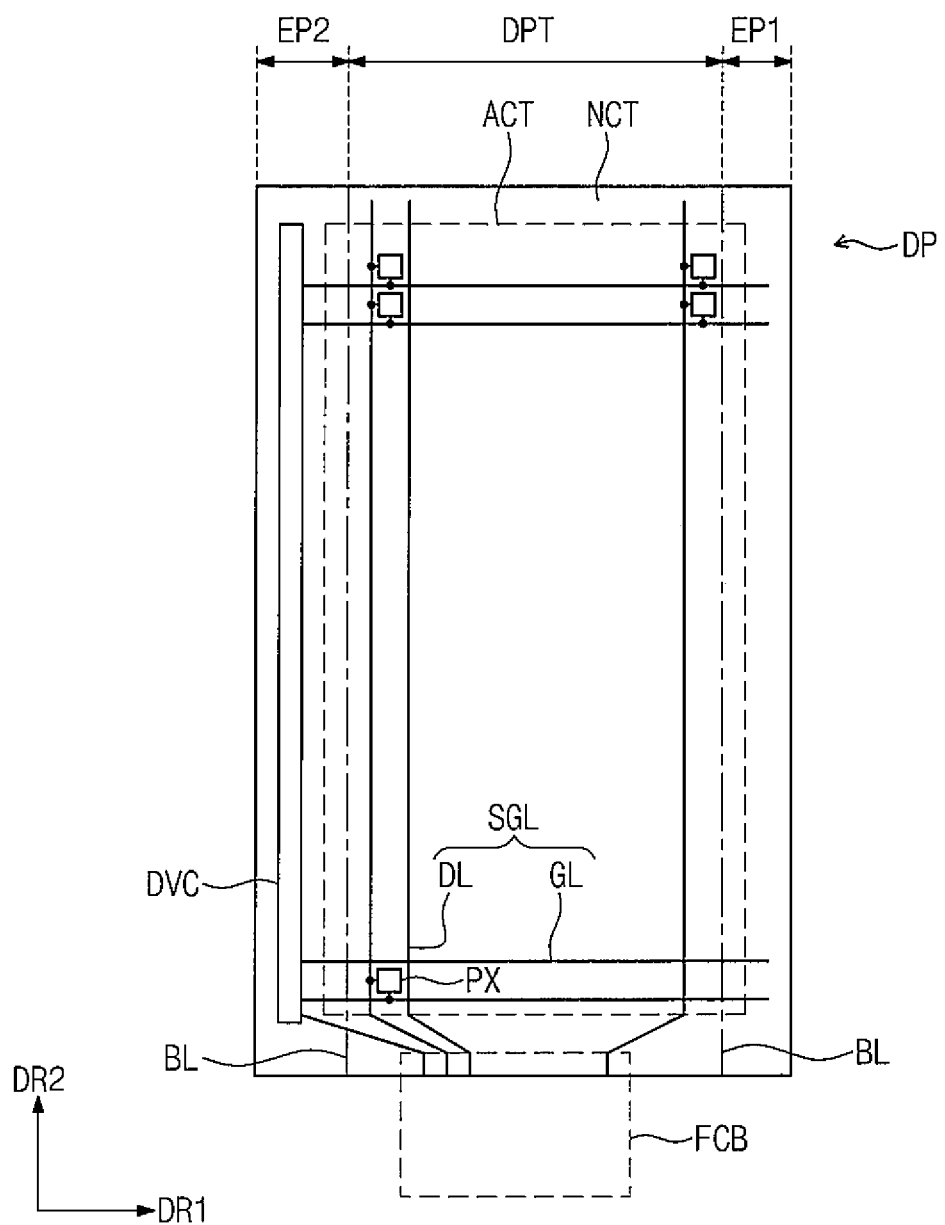
FIG. 7 is a plan view showing a display panel according to an exemplary embodiment of the present disclosure.

FIG. 6 is a perspective view showing a display panel according to an exemplary embodiment of the present disclosure, and FIG. 7 is a plan view showing a display panel according to an exemplary embodiment of the present disclosure. FIG. 7 shows a display panel that is not bent. Hereinafter, the display panel DP will be described in detail with reference to FIGS. 6 and 7. In the present exemplary embodiment, the organic light emitting display panel will be described as the display panel DP.

The display panel DP includes an active area ACT and a non-active area NCT, which are distinct from each other according to existence of a pixel PX regardless that the display panel DP is divided into the display part DPT, the first edge part EP1, and the second edge part EP2 after the display module DM is completely assembled. The pixel PX is disposed in the active area ACT and not disposed in the non-active area NCT. In the present exemplary embodiment, the non-active area NCT is provided along a border of the active area ACT.

In FIGS. 6 and 7, two folding lines BL are provided to overlap with the active area ACT, but they should not be limited thereto or thereby. That is, the two folding lines BL may be provided to overlap with the non-active area NCT. In other words, the pixel PX may not be disposed in the first and second edge parts EP1 and EP2.

Referring to FIG. 7, the display panel DP includes a plurality of signal lines SGL. The signal lines SGL include scan lines GL and data lines DL. The scan lines GL and the data lines DL are connected to corresponding pixels PX, respectively. A driving circuit DCV is disposed at one end of the non-active area NCT and connected to the scan lines GL.

The display panel DP is connected to a flexible circuit board FCB. The flexible circuit board FCB is connected to the display part DPT. The flexible circuit board FCB is connected to the data lines DL and the driving circuit DCV. The flexible circuit board FCB electrically connects the display panel DP and the main circuit member CM (refer to FIG. 2) or electrically connects the display panel DP and other circuit boards.

Figure 8:
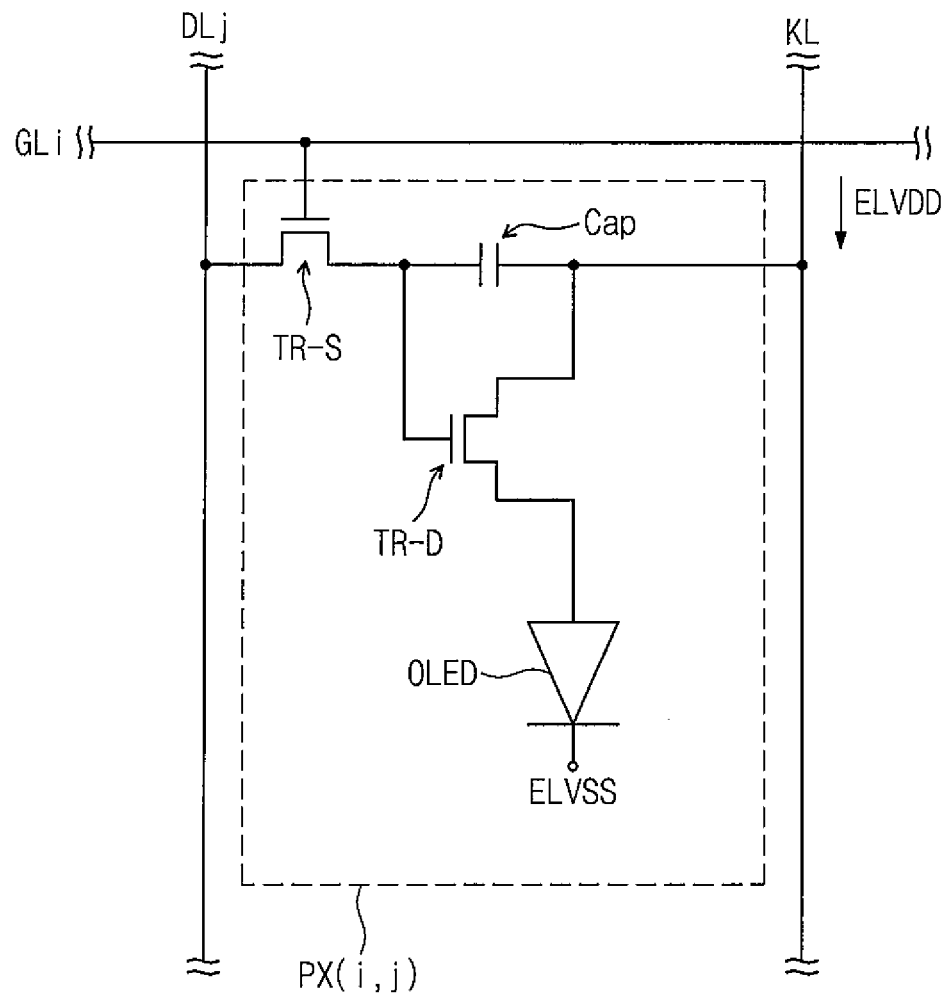
FIG. 8 is an equivalent circuit diagram showing a pixel according to an exemplary embodiment of the present disclosure.
Figure 9:
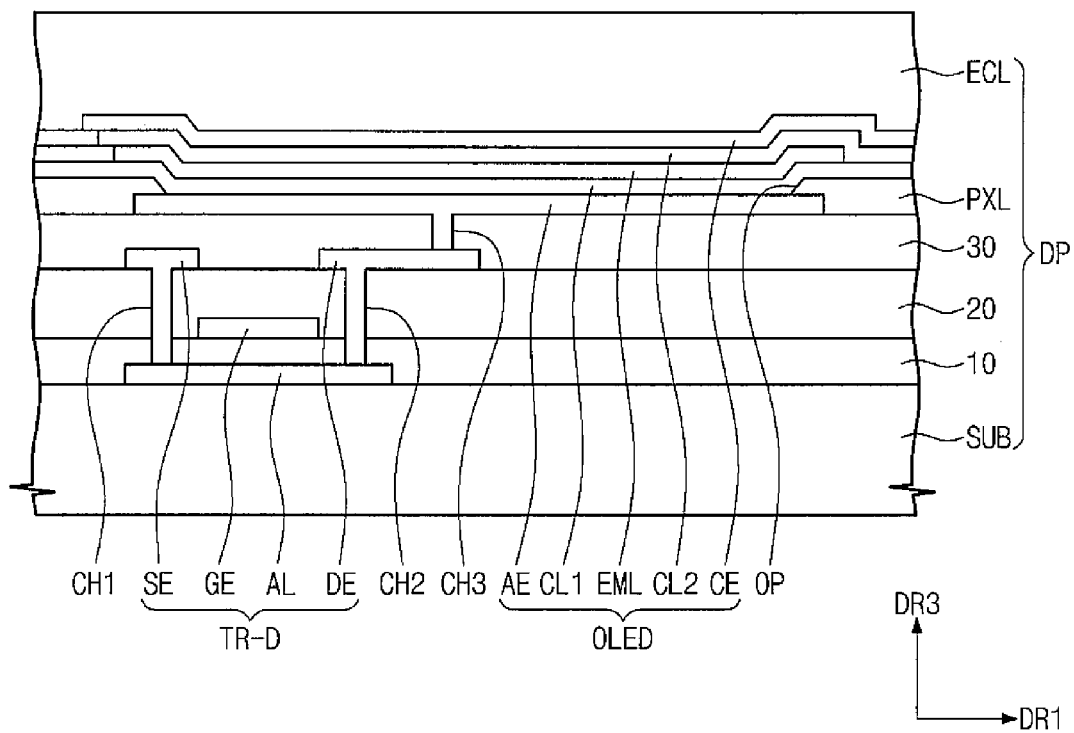
FIG. 9 is a cross-sectional view showing a pixel according to an exemplary embodiment of the present disclosure.

FIG. 8 is an equivalent circuit diagram showing a pixel according to an exemplary embodiment of the present disclosure, and FIG. 9 is a cross-sectional view showing a pixel according to an exemplary embodiment of the present disclosure. Hereinafter, the pixel will be described in more detail with reference to FIGS. 8 and 9.

FIG. 8 shows a pixel PX(i, j) connected to an i-th scan line GLi among the scan lines GL and a j-th data line DLj among the data lines DL as a representative example, but the configuration of the pixel PX(i, j) should not be limited thereto or thereby.

The pixel PX(i, j) includes an organic light emitting diode OLED as its display device. The pixel PX(i, j) includes a switching thin film transistor TR-S, a driving thin film transistor TR-D, and a capacitor Cap to drive the organic light emitting diode OLED.

The switching thin film transistor TR-S outputs a data signal applied to the j-th data line DLj in response to a scan signal applied to the i-th scan line GLi. The capacitor Cap is charged with a voltage corresponding to the data signal provided from the switching thin film transistor TR-S.

The driving thin film transistor TR-D is connected to the organic light emitting diode OLED. The driving thin film transistor TR-D controls a driving current flowing through the organic light emitting diode OLED in response to an amount of electric charges charged in the capacitor Cap. The organic light emitting diode OLED emits the light during a turn-on period of the driving thin film transistor TR-D.

Referring to FIG. 9, insulating layers 10, 20, and 30, the driving thin film transistor TR-D, and the organic light emitting diode OLED are disposed on the base substrate SUB.

The base substrate SUB may include a flexible substrate. The base substrate SUB may include plural plastic substrates (or plastic films) stacked on one another. A semiconductor pattern AL of the driving thin film transistor TR-D is disposed on the base substrate SUB. A first insulating layer 10 is disposed on the base substrate SUB to cover the semiconductor pattern AL. The first insulating layer 10 includes an organic layer and/or an inorganic layer. The first insulating layer 10 may include plural (multiple) thin layers.

A control electrode GE of the driving thin film transistor TR-D is disposed on the first insulating layer 10. A second insulating layer 20 is disposed on the first insulating layer 10 to cover the control electrode GE. The second insulating layer 20 includes an organic layer and/or an inorganic layer. The second insulating layer 20 may include plural (multiple) thin layers.

An input electrode SE and an output electrode DE of the driving thin film transistor TR-D are disposed on the second insulating layer 20. The input electrode SE and the output electrode DE are connected to the semiconductor pattern AL respectively through first and second contact holes CH1 and CH2 formed through the first and second insulating layers 10 and 20. Meanwhile, according to another embodiment, the driving thin film transistor TR-D may have a bottom gate structure.

A third insulating layer 30 is disposed on the second insulating layer 20 to cover the input electrode SE and the output electrode DE. The third insulating layer 30 includes an organic layer and/or an inorganic layer. The third insulating layer 30 may include plural (multiple) thin layers.

A pixel definition layer PXL and the organic light emitting diode OLED are disposed on the third insulating layer 30. The organic light emitting diode OLED includes an anode AE, a first common layer CL1, an organic light emitting layer EML, a second common layer CL2, and a cathode CE, which are sequentially stacked. The anode AE is connected to the output electrode DE through a third contact hole CH3 formed through the third insulating layer 30. The organic light emitting diode OLED emits light through the front surface of the display panel DP.

The anode AE is disposed on the third insulating layer 30. The pixel definition layer PXL has an opening OP formed therethrough to expose the anode AE. The first common layer CL1 is disposed on the anode AE. The first common layer CL1 is commonly disposed in the pixels PX (refer to FIG. 7). The first common layer CL1 includes a hole injection layer. The first common layer CL1 may further include a hole transport layer.

The organic light emitting layer EML is disposed on the first common layer CL1. The organic light emitting layer EML is disposed only at a position corresponding to the opening OP. The second common layer CL2 is disposed on the organic light emitting layer EML. The second common layer CL2 includes an electron injection layer. The second common layer CL2 may further include an electron transport layer. The cathode CE is disposed on the second common layer CL2. The second common layer CL2 and the cathode CE are commonly disposed in the pixels PX.

A sealing layer ECL is disposed on the cathode CE. The sealing layer ECL is commonly disposed in the pixels PX. The sealing layer ECL is overlapped with at least the active area ACT (refer to FIG. 7). The sealing layer ECL includes an organic layer and/or an inorganic layer. The sealing layer ECL may include silicon nitride layers and silicon oxide layers alternately stacked with the silicon nitride layers.

In certain embodiments, the switching thin film transistor TR-S may have the same structure as that of the driving thin film transistor TR-D. In addition, two electrodes of the capacitor Cap are disposed on different layers among the first, second, and third insulating layers 10, 20, and 30.

As shown in FIG. 6, since the first and second edge parts EP1 and EP2 are inwardly bent, a tensile stress is applied to portions of the base substrate SUB, which are disposed in the vicinity of the folding lines BL. In addition, a compressive stress is applied to portions of the sealing layer ECL, which are disposed in the vicinity of the folding lines BL. The tensile stress causes voids due to an expansion in volume. The number of voids formed in the base substrate SUB is smaller than that of the sealing layer ECL even though the tensile stress is applied to the base substrate SUB. When the first and second edge parts EP1 and EP2 are inwardly bent, the voids may be prevented from being formed in the sealing layer ECL when compared to that when the first and second edge parts EP1 and EP2 are outwardly bent. Accordingly, although the portions of the display panel DP are bent, defects occurring in the display panel DP may be reduced.

FIGS. 10 to 13 are cross-sectional views showing display modules according to exemplary embodiments of the present disclosure. In FIGS. 10 to 13, the same reference numerals denote the same elements in FIGS. 1 to 9, and thus detailed descriptions of the same elements will be omitted. In FIGS. 10 to 13, the black matrix layer BM has been omitted.

Referring to FIGS. 10 to 13, each of display modules DM10 to DM40 may further include a touch screen panel TSP or TSP10. The touch screen panel TSP senses a touch event occurring on the front surface S-F of the window member WM. The touch screen panel TSP may be realized by various suitable touch screen panels, e.g., a capacitive type touch screen panel, a resistive type touch screen panel, a sound type touch screen panel, a piezoelectric type touch screen panel, an electromagnetic induction type touch screen panel, etc.

Figure 10:
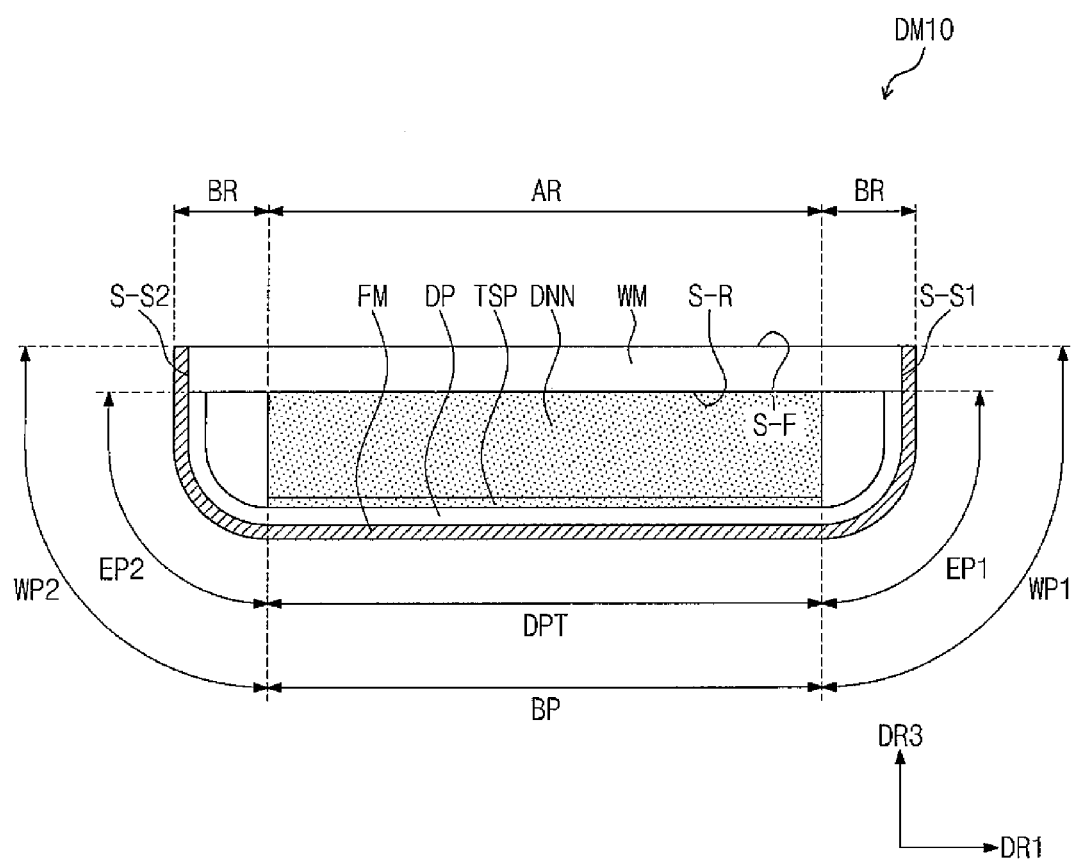
FIGS. 10 to 15 are cross-sectional views showing display modules according to exemplary embodiments of the present disclosure.

According to the display module DM10 shown in FIG. 10, the touch screen panel TSP is disposed between the dummy member DNN and the display panel DP. The touch screen panel TSP has the same area as that of the dummy member DNN or the display part DPT on the display surface.

Figure 11:
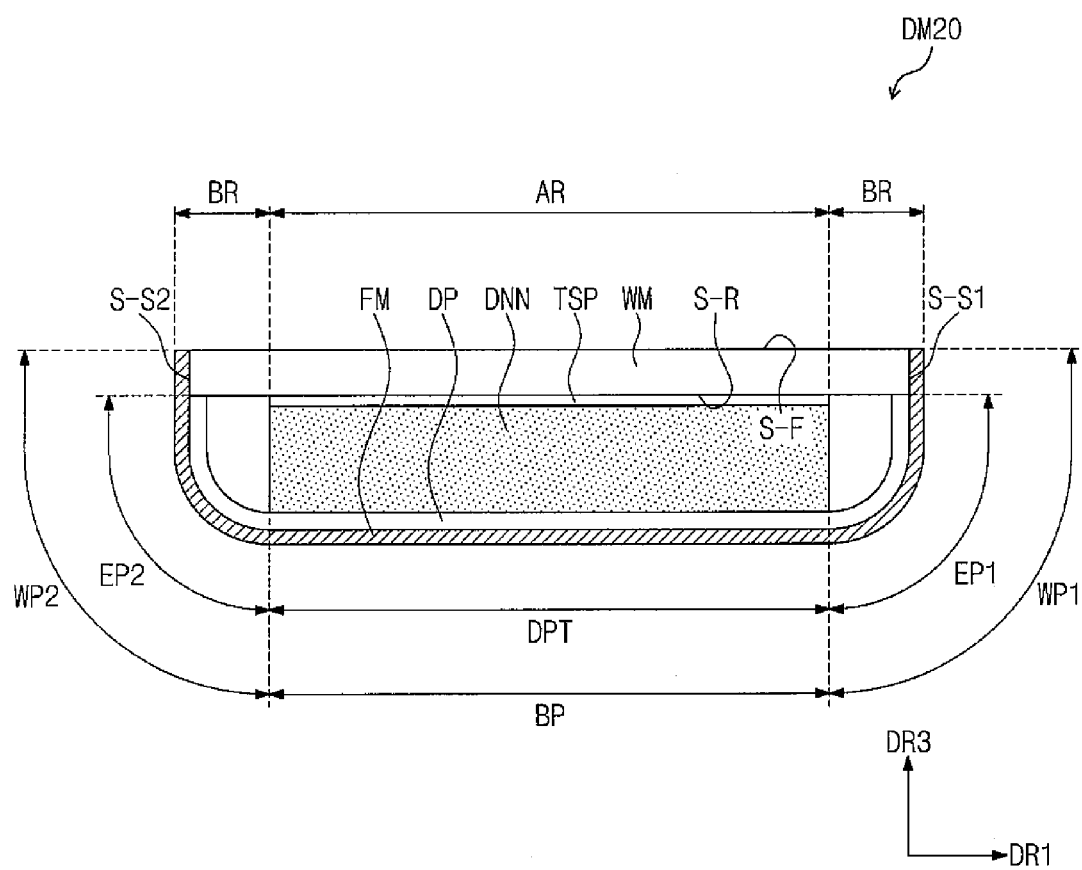

According to the display module DM20 shown in FIG. 11, the touch screen panel TSP is disposed between the window member WM and the dummy member DNN. The touch screen panel TSP has the same area as that of the dummy member DNN or the display part DPT on the display surface.

Figure 12:
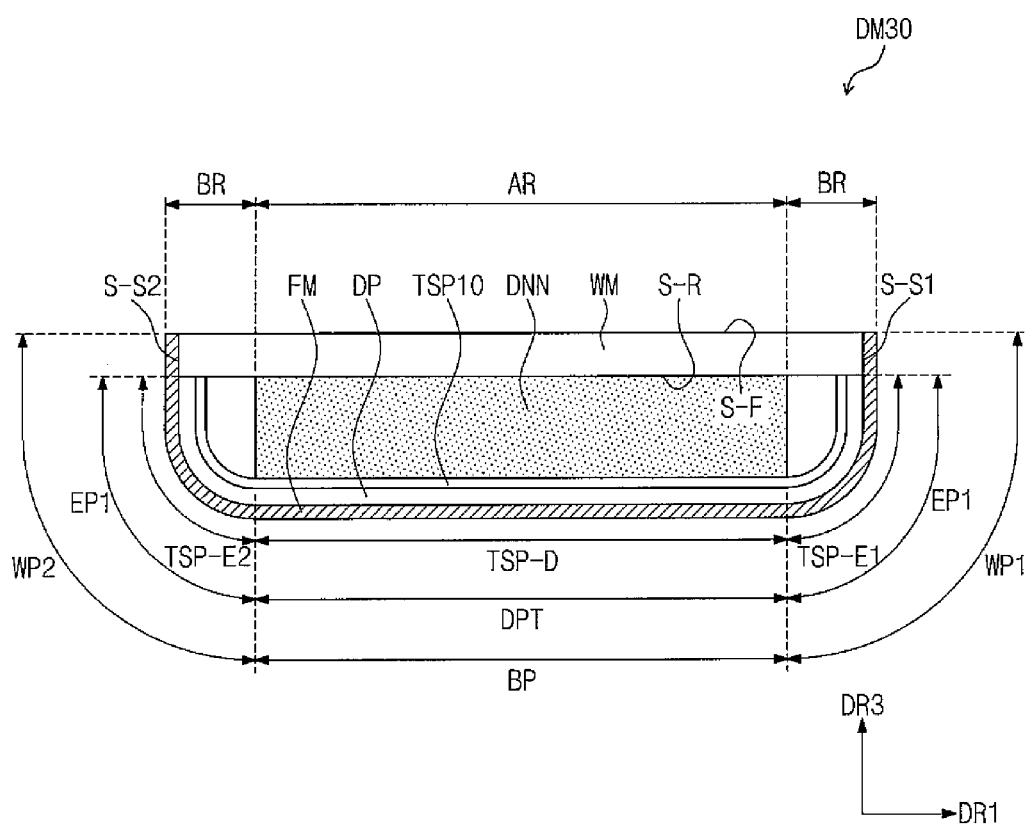

According to the display module DM30 shown in FIG. 12, the touch screen panel TSP10 is disposed on the display panel DP and has the same area as that of the display panel DP. The touch screen panel TSP10 includes a flat surface touch part TSP-D corresponding to the display part DPT, a first side surface touch part TSP-E1 corresponding to the first edge part EP1, and a second side surface touch part TSP-E2 corresponding to the second edge part EP2. According to the present exemplary embodiment, the touch event occurring on the side surfaces of the display apparatus DA (refer to FIG. 1) may be sensed by the touch screen panel TSP10.

The touch screen panel TSP10 is coupled to the front surface of the display panel DP by the pressure sensitive adhesive layer. Accordingly, the touch screen panel TSP10 is bent together with the display panel DP in the assembling process described with reference to FIG. 5.

Figure 13:
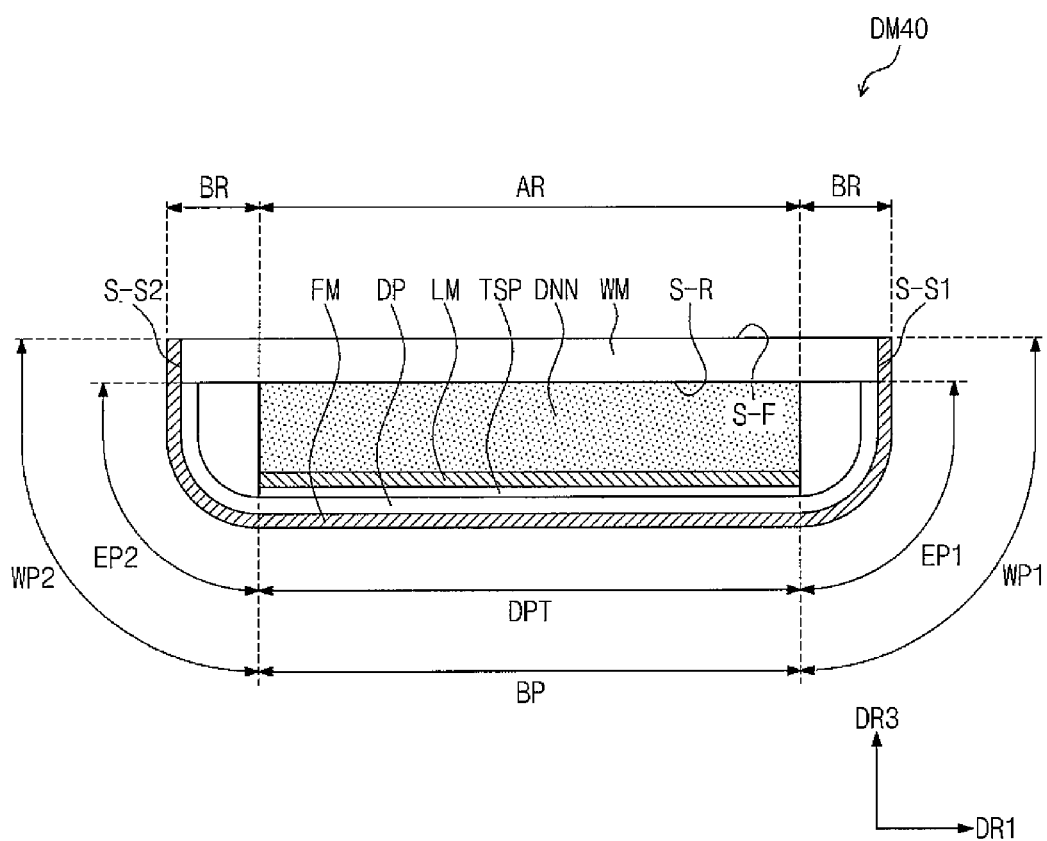

The display module DM40 shown in FIG. 13 further includes an optical member LM when compared with that of the display module DM10. The optical member LM includes a polarizer and a retarder. The polarizer is disposed on the retarder. The external light incident to the window member WM is linearly polarized passing through the polarizer. The linearly-polarized light passes through the retarder and is reflected by the display panel DP. The light reflected by the display panel DP passes through the retarder again, and then is incident to the polarizer. The phase of the external light is changed while traveling along the above-mentioned path. The external light is blocked (extent) after being reflected by the display panel DP without passing through the polarizer. Therefore, a reflectance of the display module DM40 against the external light is reduced. Although not shown in figures, the optical member LM may be disposed between the window member WM and the dummy member DNN in the present exemplary embodiment.

Figure 14:
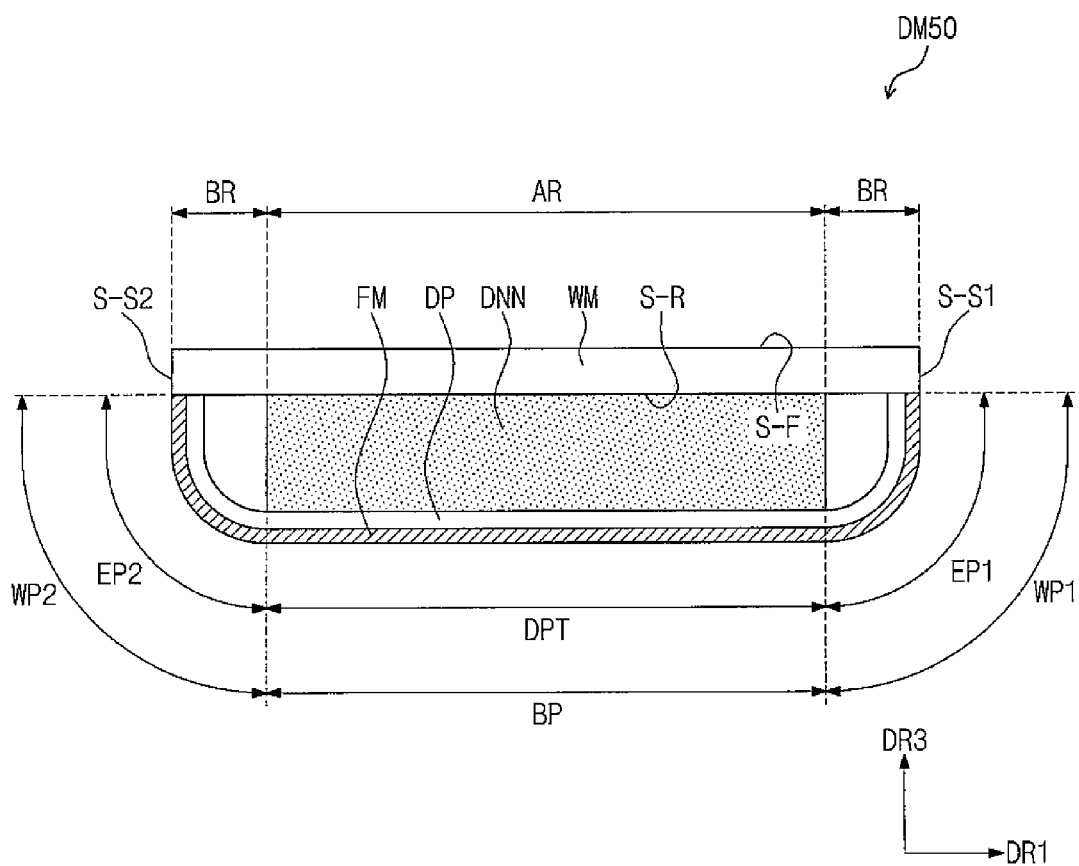

FIG. 14 is a cross-sectional view showing a display module DM50 according to an exemplary embodiment of the present disclosure. In FIG. 14, the same reference numerals denote the same elements in FIGS. 1 to 13, and thus detailed descriptions of the same elements will be omitted.

Referring to FIG. 14, the display module DM50 includes the window member WM, the dummy member DNN, the display panel DP, and the protective frame FM. The display panel DP includes the display part DPT, the first edge part EP1, and the second edge part EP2. The protective frame FM includes the bottom portion BP, the first sidewall portion WP1, and the second sidewall portion WP2, which respectively correspond to the display part DPT, the first edge part EP1, and the second edge part EP2.

As described with reference to FIG. 5, the protective frame FM and the window member WM are assembled to each other. In this case, the first and second sidewall portions WP1 and WP2 are coupled to the rear surface S-R of the window member WM. Although not shown in figures, an adhesive layer is disposed on the rear surface S-R of the window member WM to attach the end portions of the first and second sidewall portions WP1 and WP2 to the window member WM. In addition, an adhesive layer is disposed on the rear surface of the display panel DP to attach the protective frame FM to the display panel DP. Although the adhesive layers are not provided, the protective frame FM may be coupled to the display panel DP by a restoring force of the first and second edge parts EP1 and EP2 that move (tend) to return to their original positions before the protective frame FM and the window member WM are assembled to each other.

As described above, since the protective frame FM is completely overlapped with the window member WM on the display surface, the area of the bezel area BR is more reduced than that of the bezel area BR shown in FIG. 3. In FIG. 14, the end portions of the first and second edge parts EP1 and EP2 make contact with the rear surface S-R of the window member WM, but they should not be limited thereto or thereby. That is, the end portions of the first and second edge parts EP1 and EP2 may be spaced apart from the rear surface S-R of the window member WM.

Although not shown in figures, the display module DM50 according to the present exemplary embodiment may further include the touch screen panel TSP or TSP10 as shown in FIGS. 10 to 12. In addition, the display module DM50 may further include the optical member LM as shown in FIG. 13.

Figure 15:
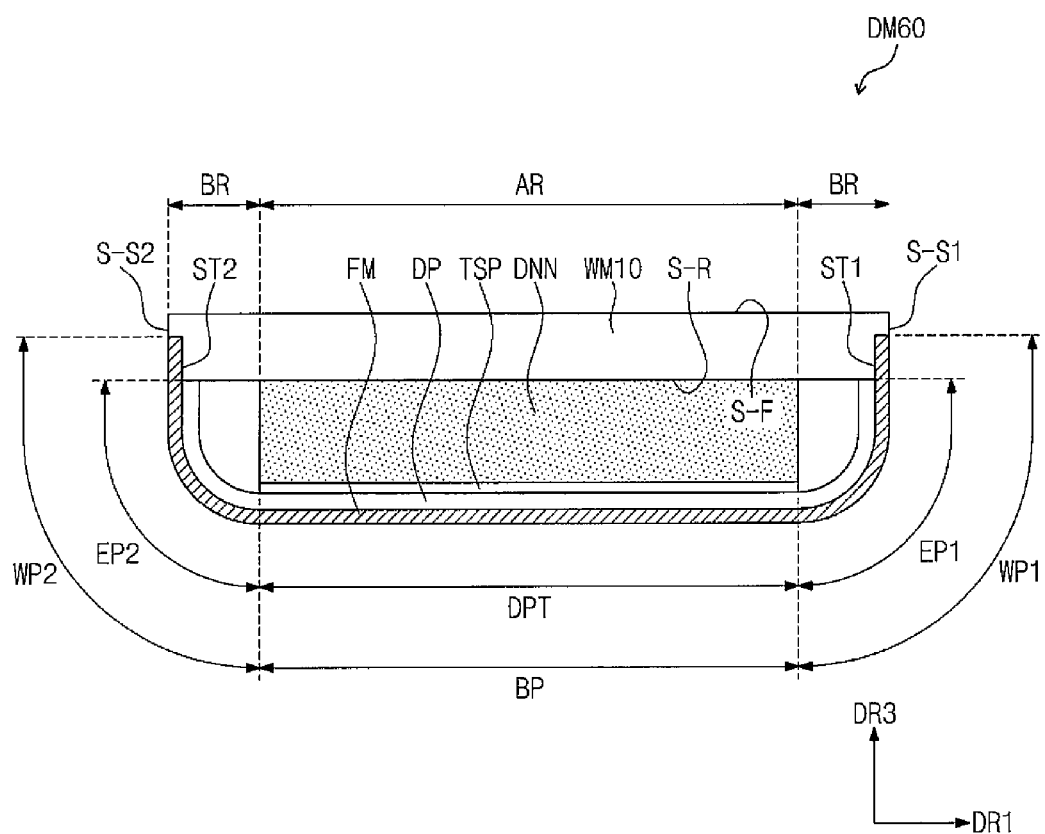

FIG. 15 is a cross-sectional view showing a display module DM60 according to an exemplary embodiment of the present disclosure. In FIG. 15, the same reference numerals denote the same elements in FIGS. 1 to 14, and thus detailed descriptions of the same elements will be omitted.

Referring to FIG. 15, the display module DM60 includes a window member WM10, the dummy member DNN, the display panel DP, and the protective frame FM. The display panel DP includes the display part DPT, the first edge part EP1, and the second edge part EP2. The protective frame FM includes the bottom portion BP, the first sidewall portion WP1, and the second sidewall portion WP2, which respectively correspond to the display part DPT, the first edge part EP1, and the second edge part EP2.

As shown in FIG. 15, the window member WM10 includes at least one step difference portion. The window member WM10 includes a first step difference portion ST1 defined between the rear surface S-R and the first side surface S-S1 and a second step difference portion ST2 defined between the rear surface S-R and the second side surface S-S2.

Each of the first and second step difference portions ST1 and ST2 includes step difference surfaces. One of the step difference surfaces is substantially parallel to the rear surface S-R, and the other of the step difference surfaces is substantially parallel to the first and second side surfaces S-S1 and S-S2. In the present exemplary embodiment, the step difference surfaces may form one curved surface. Consequently, the connection surface of the window member WM10 according to the present exemplary embodiment includes four side surfaces S-S1 to S-S4 and the step difference surfaces.

The end portion of the first sidewall portion WP1 is coupled to the first step difference portion ST1, and the end portion of the second sidewall portion WP2 is coupled to the second step difference portion ST2. Although not shown in figures, an adhesive layer may be disposed on the first and second step difference portions ST1 and ST2 to attach the end portions of the first and second sidewall portions WP1 and WP2 to the window member WM10. As described above, since the protective frame FM is completely overlapped with the window member WM10 on the display surface, the area of the bezel area BR is more reduced than that of the bezel area BR shown in FIG. 3.

Although not shown in figures, the display module DM60 according to the present exemplary embodiment may further include the touch screen panel TSP or TSP10 as shown in FIGS. 10 to 12. In addition, the display module DM50 may further include the optical member LM as shown in FIG. 13.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed, and equivalents thereof.

What is claimed is:

1. A display module comprising:
   a window member comprising a front surface, a rear surface facing away from the front surface in a thickness direction, and a connection surface coupling the front surface to the rear surface;
   a display panel comprising a display part spaced apart from the rear surface of the window member and to display an image toward the window member, and an edge part bent from the display part toward the window member;
   a protective frame coupled to at least one of the rear surface of the window member and the connection surface to accommodate the display panel; and
   a black matrix layer disposed on the rear surface of the window member and overlapping the edge part.

2. The display module of claim 1, wherein the protective frame comprises:
   a bottom portion corresponding to the display part; and
   a sidewall portion bent from the bottom and corresponding to the edge part.

3. The display module of claim 2, wherein the edge part comprises:
   a first edge part extending from one end of the display part; and
   a second edge part extending from an other end of the display part, which faces the one end in a first direction, and the sidewall portion comprises:
   a first sidewall portion corresponding to the first edge part; and
   a second sidewall portion corresponding to the second edge part.

4. The display module of claim 3, wherein the sidewall portion further comprises first and second dummy sidewall portions to connect the first and second sidewall portions, and the first and second dummy sidewall portions face each other in a second direction substantially perpendicular to the first direction.

5. The display module of claim 3, wherein the first and second sidewall portions are coupled to the rear surface of the window member.

6. The display module of claim 3, wherein the connection surface comprises a plurality of side surfaces, the first sidewall portion is coupled to a first side surface of the side surfaces, and the second sidewall portion is coupled to a second side surface of the side surfaces, the second side surface facing away from the first side surface in the first direction.

7. The display module of claim 6, wherein the first and second edge parts are coupled to the rear surface of the window member.

8. The display module of claim 3, wherein the connection surface comprises a plurality of side surfaces and a plurality of step difference surfaces, the window member comprises a first step difference portion to connect the rear surface of the window member and a first side surface of the side surfaces, and a second step difference portion to connect the rear surface of the window member and a second side surface of the side surfaces, the second side surface facing away from the first side surface in the first direction, and the step difference surfaces define the first and second step difference portions.

9. The display module of claim 8, wherein the first sidewall portion is coupled to the first step difference portion, and the second sidewall portion is coupled to the second step difference portion.

10. The display module of claim 1, wherein the black matrix layer has an opening formed therethrough to correspond to the display part.

11. The display module of claim 1, wherein the display panel comprises:
a base substrate on the protective frame;
a plurality of organic light emitting diodes on the base substrate; and
a sealing layer disposed on the base substrate to cover the organic light emitting diodes.

12. The display module of claim 1, further comprising a dummy member between the display panel and the window member.

13. The display module of claim 1, further comprising a touch screen panel between the display panel and the window member.

14. The display module of claim 1, wherein the connection surface comprises a plurality of side surfaces and a plurality of step difference surfaces, the window member comprises a first step difference portion to connect the rear surface of the window member and a first side surface of the side surfaces, and a second step difference portion to connect the rear surface of the window member and a second side surface of the side surfaces, the second side surface facing away from the first side surface in a first direction, and the step difference surfaces define the first and second step difference portions.

15. A display module comprising:
a window member comprising a front surface, a rear surface facing away from the front surface in a thickness direction, and a connection surface coupling the front surface to the rear surface;
a display panel comprising a display part spaced apart from the rear surface of the window member and to display an image toward the window member, and an edge part bent from the display part toward the window member;
a protective frame coupled to at least one of the rear surface of the window member and the connection surface to accommodate the display panel, the protective frame comprising:
a bottom portion corresponding to the display part; and
a sidewall portion bent from the bottom and corresponding to the edge part; and
a dummy member between the display panel and the window member,
wherein the edge part comprises:
a first edge part extending from one end of the display part; and
a second edge part extending from an other end of the display part, which faces the one end in a first direction, and
the sidewall portion comprises:
a first sidewall portion corresponding to the first edge part; and
a second sidewall portion corresponding to the second edge part.

16. The display module of claim 15, further comprising a touch screen panel between the display panel and the dummy member.

17. The display module of claim 16, wherein the touch screen panel comprises:
a flat surface touch part corresponding to the display part;
a first sidewall touch part corresponding to the first edge part; and
a second sidewall touch part corresponding to the second edge part.

18. The display module of claim 15, further comprising a touch screen panel between the window member and the dummy member.

19. The display module of claim 15, further comprising an optical member between the display panel and the window member.

20. A display apparatus comprising:
a display module;
a main circuit member electrically coupled to the display module; and
a housing accommodating the main circuit member and coupled to the display module, the display module comprising:
a window member comprising a front surface, a rear surface facing away from the front surface in a thickness direction, and a connection surface coupling the front surface to the rear surface;
a display panel comprising a display part spaced apart from the rear surface of the window member and to display an image toward the window member, and an edge part bent from the display part toward the window member;
a protective frame coupled to at least one of the rear surface of the window member and the connection surface to accommodate the display panel; and
a black matrix layer disposed on the rear surface of the window member and overlapping the edge part.

* * * * *